(12) United States Patent
Vats (10) Patent No.: US 7,564,308 B1
(45) Date of Patent: Jul. 21, 2009

(54) SELF-BIASED OPERATIONAL AMPLIFIER

(75) Inventor: Saurabh Vats, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 70 days.

(21) Appl. No.: 11/818,398

(22) Filed: Jun. 13, 2007

(51) Int. Cl.
*H03F 3/45* (2006.01)
(52) U.S. Cl. .................... 330/259; 330/255; 330/290
(58) Field of Classification Search ......... 330/257–260, 330/253
See application file for complete search history.

(56) References Cited

U.S. PATENT DOCUMENTS

| 5,321,371 | A | * | 6/1994 | Harvey | 330/288 |
| 6,052,025 | A | * | 4/2000 | Chang et al. | 330/253 |
| 6,590,980 | B1 | * | 7/2003 | Moraveji | 380/255 |
| 7,005,921 | B2 | * | 2/2006 | McCalmont | 330/259 |

* cited by examiner

*Primary Examiner*—Robert Pascal
*Assistant Examiner*—Hieu P Nguyen (57) ABSTRACT

An operational amplifier in accordance with one embodiment of the invention includes folded cascode transistors and a self-biased common-mode feedback circuit coupled to the folded cascode transistors. The operational amplifier can include an output stage coupled to the self-biased common-mode feedback circuit and the folded cascode transistors.

20 Claims, 6 Drawing Sheets

SELF-BIASED OPERATIONAL AMPLIFIER

BACKGROUND

Integrated circuits are utilized in a wide variety of applications. For example, integrated circuits are found within computer systems, mobile telephones, portable digital music players, and automobiles, to name a few. One of the components that can be fabricated as part of an integrated circuit is an operational amplifier circuit, which can receive an input electrical signal and output that signal with increased power. One desirable type of operational amplifier is one that can produce a high drive output current while operating with low voltages. However, it can be difficult to design such an operational amplifier.

For example, one conventional technique is to use an almost fully differential topology for the operational amplifier, which increases the voltage swing to drive a class A/B output stage. This type of topology involves a differential signal path all the way up to the output stage. However, it is difficult to make this circuit a rail-to-rail input because, usually, two parallel differential input pairs are required to achieve operability over the entire range between the two rails. Note that depending on the input common-mode voltage of the operational amplifier, only one of these pairs is on at one time. When these pairs are switched, there is a significant change in the direct current (DC) bias voltages inside the operational amplifier circuit. As such, a conventional common-mode feedback circuit is included as part of the operational amplifier to try and maintain the DC bias voltages during the switch. However, the inclusion of the conventional common-mode feedback circuit fails to prevent a huge change in bias voltages and allows a huge increase in supply current during the switch.

As such, it is desirable to address one or more of the above issues.

SUMMARY

An operational amplifier in accordance with one embodiment of the invention includes folded cascode transistors and a self-biased common-mode feedback circuit coupled to the folded cascode transistors. The operational amplifier can include an output stage coupled to the self-biased common-mode feedback circuit and the folded cascode transistors.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
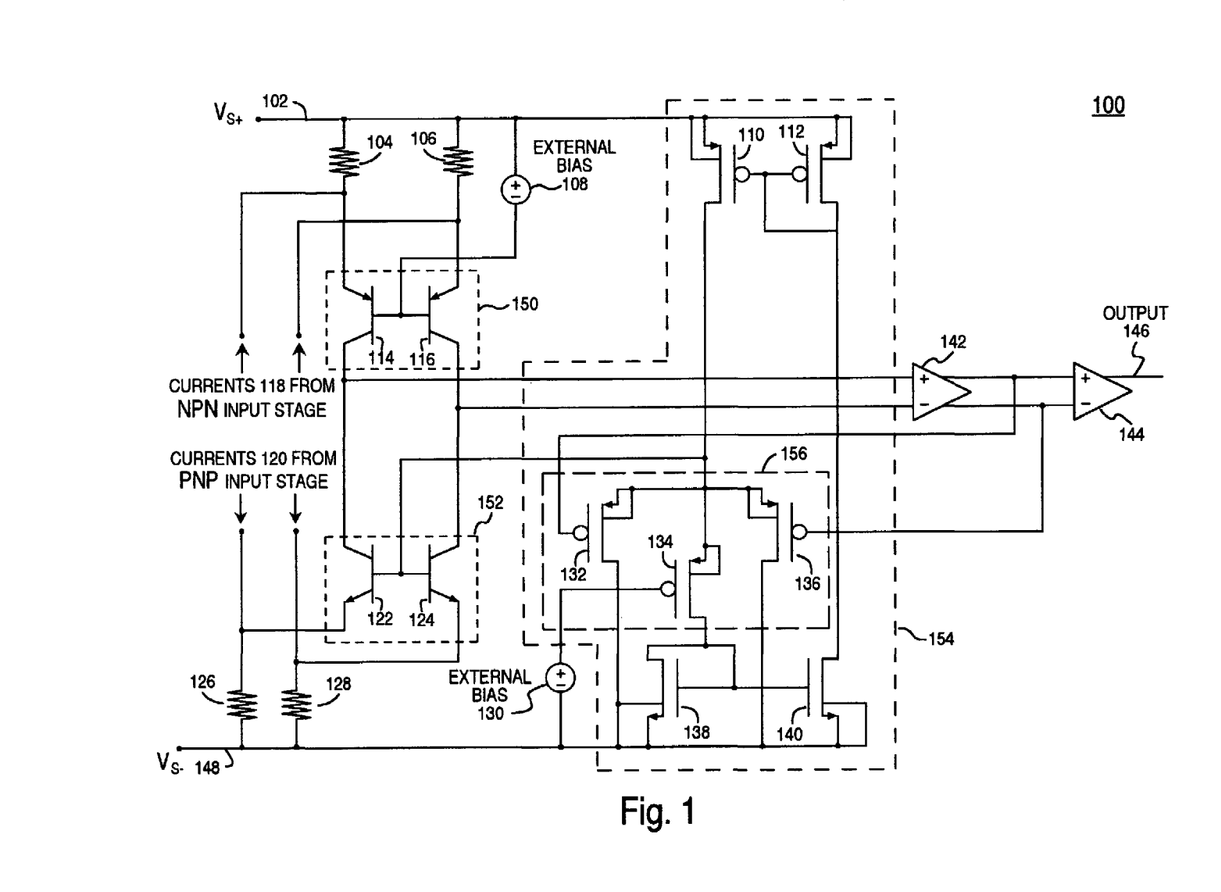
FIG. 1 is a schematic diagram of an exemplary self-biased differential operational amplifier in accordance with various embodiments of the invention.

FIG. 1 is a schematic diagram of an exemplary self-biased differential operational amplifier 100 in accordance with various embodiments of the invention. Specifically, the self-biased differential operational amplifier 100 can include, but is not limited to, a self-biasing common-mode feedback circuit 154, PNP folded cascode transistors 150, NPN folded cascode transistors 152, a buffer stage 142, and an output stage 144. Furthermore, the self-biased differential operational amplifier 100 is a fully differential circuit that can include two differential inputs: an NPN differential input stage and a PNP differential input stage (both not shown). It is pointed out that it is desirable to have a fully differential circuit because it assists the functionality of the output stage 144 since it can sink and source large currents. Note that the self-biased differential operational amplifier 100 enables quality common-mode feedback which enhances the current drive capability of its output stage 144. Additionally, the self-biased differential operational amplifier 100 can produce a high drive output current while operating with low voltages. It is noted that the output stage 144 can function without any interference from the self-biasing common-mode feedback circuit 154.

Specifically, the self-biased differential operational amplifier 100 can be implemented with a "rail-to-rail" input that can include a PNP differential input stage (not shown) and an NPN differential input stage (not shown) that can operate in parallel and tandem, wherein one of them is switched "off" when the other is switched "on". As such, the rail-to-rail input enables the self-biased differential operational amplifier 100 to operate in the entire voltage range located between a positive power supply ($V_{S+}$) 102 and a negative power supply ($V_{S-}$) 148. For example, when the PNP differential input stage is switched off and the NPN differential input stage is turned on, the currents 120 from the PNP differential input stage will stop flowing into the emitters of the NPN folded cascode transistors 152 and the currents 118 from the NPN differential input stage can start flowing into the emitters of the PNP fold cascode transistors 150. When that occurs, there could possibly be a huge direct current (DC) shift in the common-mode voltage. However, the self-biasing common-mode feedback circuit 154 of the self-biased differential operational amplifier 100 can prevent or stop the output common-mode voltage from shifting too much.

Within FIG. 1, for example, given that the currents 118 from the NPN input stage are turned off and the currents 120 from the PNP input stage are turned on as the common-mode voltage shifts, initially the emitter voltage of transistors 122 and 124 (of the NPN folded cascode transistors 152) can shift up along with their collector voltage since the NPN folded cascode transistors 152 acts like a common-mode base stage. Once that occurs, the gate voltages of transistors 132 and 136 both shift up, which substantially turns off transistors 132 and 136. As such, approximately all the current that was being output by transistor 110 starts flowing into transistor 134. It is pointed out that transistors 132, 134 and 136 can be referred to as a three-pronged differential comparator stage 156. Note that the current flowing through transistor 134 will also be the current flowing into transistor 138, thereby increasing the current in transistors 138 and 140. That is, the current flowing through transistor 134 and into transistor 138 can be mirrored into transistor 140. Additionally, the current flowing into transistor 140 can be driven into transistor 112, and that current can be mirrored into transistor 110 which completes the loop. More specifically, when transistors 132 and 136 are turned off because of the increasing voltage, transistor 134 turns on more, which conducts more current through transistors 138, 140, and 112, and again into transistor 110. Note that the current flowing through transistor 134 can be used to bias the self-biasing common-mode feedback circuit 154 as well as the self-biased differential operational amplifier 100 via transistors 138, 140, 112 and 110. The transistors 138, 140, 112 and 110 can be referred to as a self-biasing component or arrangement of the self-biasing common-mode feedback circuit 154. It is pointed out that the common source of transistors 132, 134, and 136 is connected to the base of transistors 122 and 124 (which form the NPN folded cascode transistors 152). As such, when the common source voltage of transistors 132, 134, and 136 increases, then the base voltage of transistors 122 and 124 increases and results in pulling down their collector voltage. In this manner, there is a negative feedback within the self-biased operational amplifier 100.

In an embodiment in accordance with the invention, it is noted that the gain of the loop formed by transistors 134, 138, 140, 112 and 110 of the self-biasing common-mode feedback circuit 154 can be implemented such that it is less than one. It is pointed out that if the gain of the loop is greater than one in an embodiment of the invention, then the self-biasing common-mode feedback circuit 154 may saturate and go to the positive power supply 102 or to the negative power supply 148. In order to avoid this situation, in one embodiment, the width of transistor 112 can be implemented such that it is less than a third of the width of transistor 110. In other words, the width ratio of transistor 112 to transistor 110 can be less than one third, but is not limited to such.

Within the self-biased differential operational amplifier 100, note that a positive terminal of an external bias voltage 130 can be coupled to the gate of transistor 134 while a negative terminal of the external bias voltage 130 can be coupled to the negative power supply 148. As such, in one embodiment, the common-mode voltage at the collectors of the NPN folded cascode transistors 152 should be close or similar to the external bias voltage 130. However, if the common-mode voltage is too high compared to the external bias voltage 130, then the self-biasing common-mode feedback circuit 154 strives to keep the voltage at the collectors of the NPN folded cascode transistors 152 substantially equal to the externally biased voltage 130. It is pointed out that the external bias voltage 130 can be implemented in a wide variety of ways. For example in an embodiment, the external bias voltage 130 can be a voltage source that is independent of the self-biased common-mode feedback circuit 154, wherein the external bias voltage 130 can be external and/or internal to the differential operational amplifier 100.

Within FIG. 1, when the currents 120 from the PNP differential input stage are turned off and the currents 118 from the NPN differential input stage are turned on as the common-mode voltage shifts, initially the emitter voltage of transistors 114 and 116 (of the PNP folded cascode transistors 150) can shift up which can cause their collector voltage to shift down. The lowering of the collector voltage of transistors 114 and 116 can be received and transferred by the buffer stage 142 and received by the gates of transistors 132 and 136. Since the gate voltages of transistors 132 and 136 are lower and their source voltage is still high, transistors 132 and 136 can be substantially turned on thereby allowing more current to flow through them. However, transistor 134 can be substantially starved of current. Since transistor 134 can be substantially starved of current, there will be less current flowing to transistors 138, 140, 112, and 110 thereby resulting in the common source node voltage of transistors 132, 134, and 136 getting pulled up (which is also coupled to the common base node of transistors 122 and 124 that form the NPN folded cascode transistors 152). When the voltage is pulled up at the base node of transistors 122 and 124, that can result in pulling down the voltage of their collectors. Since the collectors of transistors 122, 124, 114 and 116 are common, the voltage of the collectors of transistors 114 and 116 of the PNP folded cascode transistors 150 are also be pulled down. In this manner, there is a negative feedback within the self-biased operational amplifier 100.

It is pointed out that whether the change in current happens in the emitters of the PNP folded cascode transistors 150 or in the emitters of the NPN folded cascode transistors 152, that change can be felt or detected on the collectors of transistors 114, 116, 122, and 124. Specifically, the self-biasing common-mode feedback circuit 154 can normally sense or detect the voltage change at the collectors of transistors 114, 116, 122, and 124, which can be utilized to detect the shift and maintain the collector voltage in order to prevent any substantial change in the output biasing stage 144. It is noted that the common-mode voltage feedback of the self-biasing common-mode feedback circuit 154 can be controlled via the feedback coupling that exists between the base node of the NPN folded cascode transistors 152 and the common source of the transistors 132, 134 and 136 of the three-pronged differential comparator stage 156.

Within FIG. 1, the self-biased operational amplifier 100 can include an external bias voltage 108, wherein a positive terminal of the external bias voltage 108 can be coupled to the positive power supply 102 while its negative terminal can be coupled to the base node of transistors 114 and 116. It is pointed out that the external bias voltage 108 can be implemented in a wide variety of ways. For example in an embodiment, the external bias voltage 108 can be a voltage source that is independent of the self-biased common-mode feedback circuit 154, wherein the external bias voltage 108 can be external and/or internal to the differential operational amplifier 100. Furthermore, in one embodiment, the self-biasing common-mode feedback circuit 154 can include the three-pronged differential comparator stage 156 (e.g., which includes transistors 132, 134 and 136), and the current that passes through one of the prongs (e.g., transistor 134) can be mirrored back to bias the tail current of the three-pronged differential stage 156. It is noted that positive feedback can be avoided within the self-biasing common-mode feedback circuit 154 by starving the bias transistor 110 of current.

Note that the common source of the three-pronged differential stage 156 can be used to bias the folded cascode NPN transistors 152. If the common-mode voltage at the collectors of transistors 114, 116, 122 and 124 increases, the current through the transistors 132 and 136 reduces and flows through the biasing branch transistor 134. This increases the current through the self-bias transistors 110 and 112 and hence increases the common source voltage of transistors 132, 134 and 136 along with the base voltage of the NPN folded cascode transistors 152 until the common-mode voltage is reduced again. Since the gain through the loop formed the PNP folded cascode transistors 150 or the NPN folded cascode transistors 152 (depending on which is active), buffer stage 142 and the three-pronged differential stage 156 of the self-biased operational amplifier 100 can be set high, a little change in common-mode feedback causes a much larger change in the base voltages of the NPN folded cascode transistors 152, hence improving the performance of the self-biased operational amplifier 100. Note that the self-biasing common-mode feedback circuit 154 can have a much wider input range since the tail current is not affected by the gate voltages of transistors 132, 134 and 136. As such, this allows for higher output current from output 146 of the self-biased operational amplifier 100. Furthermore, the self-biased operational amplifier 100 can have a wide input range since a drastic increase in either of the gate voltages of transistors 132 and 136 does not affect the current in the other two transistors of the three-pronged differential stage 156. As such, this allows a larger differential input voltage to reach the output stage 144 and hence call result in a much larger drive current capability. This can result in a fuller utilization of the benefits of a class A/B output stage topology (which can be an implementation of the output stage 144 in one embodiment). It is pointed out that output stage 144 can convert its differential input to a single-ended output 146.

Within FIG. 1, it is noted that the self-biased differential operational amplifier 100 can have a broad voltage range of operation when implemented with the self-biasing common-mode feedback circuit 154. For example, transistors 132 and 136 can be used to sense or detect the voltage at the inputs of output stage 144. As such, the self-biasing common-mode feedback circuit 154 can enable the voltage to have a greater swing. In one embodiment, the self-biasing common-mode feedback circuit 154 enables the design of a 1.8 volt self-biased differential operational amplifier 100 that can source/sink more than 20 milliamperes (mA) at −40 degrees Celsius (C). This can be accomplished since the self-biased differential operational amplifier 100 has a fully-differential input stage to drive a class A/B output stage (e.g., 144). Additionally in an embodiment, the self-biased differential operational amplifier 100 can provide an improvement in supply current performance with respect to common-mode voltage. Specifically, this provides a better value since it prevents the waste of power caused by excess quiescent current when the common-mode voltage is switched.

In an embodiment in accordance with the invention, the transistors 132, 134 and 136 can each be implemented with a low threshold voltage ($V_T$) which allows each to turn on and off more easily and not use too much supply voltage, hence allowing a larger input range for the self-biasing common-mode feedback circuit 154. For example in one embodiment, the threshold voltage of each of the transistors 132, 134 and 136 can be approximately 0.1 volts, but is not limited to such. Furthermore in one embodiment, the threshold voltage of each of the transistors 110 and 112 can be approximately 0.7-0.8 volts, but is not limited to such.

Within FIG. 1, the self-biased operational amplifier 100 can include a positive power supply ($V_{S+}$) 102 that can be coupled to a first terminal of resistor 104, a first terminal of resistor 106, and the sources and substrates of transistors 110 and 112. A second terminal of resistor 104 can be coupled to the emitter of transistor 114 and can be coupled to receive currents 118 from the NPN input stage. A second terminal of resistor 106 can be coupled to the emitter of transistor 116 and can be coupled to receive currents 118 from the NPN input stage. A positive terminal of the external bias voltage 108 can be coupled to the positive power supply 102 while a negative terminal of the external bias voltage 108 can be coupled to the bases of transistors 114 and 116. The collector of transistor 114 can be coupled to the collector of transistor 122 and a positive input terminal of buffer stage 142. The collector of transistor 116 can be coupled to the collector of transistor 124 and a negative input terminal of buffer stage 142. The emitter of transistor 122 can be coupled to a first terminal of resistor 126 and can be coupled to receive currents 120 from the PNP input stage. The emitter of transistor 124 can be coupled to a first terminal of resistor 128 and can be coupled to receive currents 120 from the PNP input stage.

The self-biased operational amplifier 100 can include a negative power supply ($V_{S-}$) 148 that can be coupled to a second terminal of resistor 126, a second terminal of resistor 128, the drains of transistors 132 and 136, and the sources and substrates of transistors 138 and 140. A negative terminal of the external bias voltage 130 can be coupled to the negative power supply 148 while a positive terminal of the external bias voltage 130 can be coupled to the gate of transistor 134. The source and substrate of transistor 134 can be coupled to the sources and substrates of transistors 132 and 136, the drain of transistor 110, and the bases of transistors 122 and 124. Additionally, the drain of transistor 134 can be coupled to the drain of transistor 138 along with the gates of transistors 138 and 140. The drain of transistor 140 can be coupled to the drain of transistor 112 and the gates of transistors 110 and 112. The gate of transistor 132 can be coupled to a first output of buffer stage 142 and a positive input of output stage 144. The gate of transistor 136 can be coupled to a second output of buffer stage 142 and a negative input of output stage 144.

Within FIG. 1, note that each of transistors 110, 112, 114, 116, 122, 124, 132, 134, 136, 138, and 140 can be implemented in a wide variety of ways. For example, each of transistors 110, 112, 132, 134 and 136 can be implemented as, but is not limited to, a P-channel MOSFET (metal-oxide semiconductor field-effect transistor) which is also known as a PMOS or PFET. Additionally, each of transistors 138 and 140 can be implemented as, but is not limited to, an N-channel MOSFET which is also known as a NMOS or NFET. Furthermore, each of transistors 114 and 116 can be implemented as, but is not limited to, a PNP bipolar junction transistor (BJT). Moreover, each of transistors 122 and 124 can be implemented as, but is not limited to, a NPN bipolar junction transistor (BJT). It is noted that each of transistors 110, 112, 114, 116, 122, 124, 132, 134, 136, 138, and 140 can be referred to as a switching element. Note that a gate, a drain, and a source of transistors 110, 112, 132, 134, 136, 138 and 140 can each be referred to as a terminal of its transistor. Additionally, each gate of transistors 110, 112, 132, 134, 136, 138 and 140 can also be referred to as a control terminal of its transistor. Also, an emitter, a base, and a collector of transistors 114, 116, 122 and 124 can each be referred to as a terminal of its transistor. Furthermore, each base of transistors 114, 116, 122 and 124 can also be referred to as a control terminal of its transistor.

In one embodiment, transistors 110, 112, 132, 134 and 136 can each be implemented as a NMOS device while transistors 138 and 140 can each be implemented as a PMOS device. Note that if these changes were implemented, the output stage 144 could be implemented with PNP transistors, but is not limited to such. Additionally in an embodiment, transistors 114 and 116 can each be implemented as a NPN transistor while transistors 122 and 124 can each be implemented as a PNP transistor. In an embodiment, note that the buffer stage 142 can be implemented as part of the self-biased operational amplifier 100 in order to prevent the loading of the input stage by the output stage 144.

Within FIG. 1, it is understood that circuit 100 may not include all of the elements illustrated by FIG. 1. Additionally, circuit 100 can be implemented to include one or more elements not illustrated by FIG. 1. In one embodiment, it is understood that resistors 104, 106, 126 and 128 can be external to the integrated circuit, internal to (or incorporated with, or part of) the integrated circuit, or any combination thereof. In an embodiment, the resistance (or impedance) of resistor 104 is substantially equal to that of resistor 106 while the resistance (or impedance) of resistor 126 is substantially equal to that of resistor 128.

Figure 2:
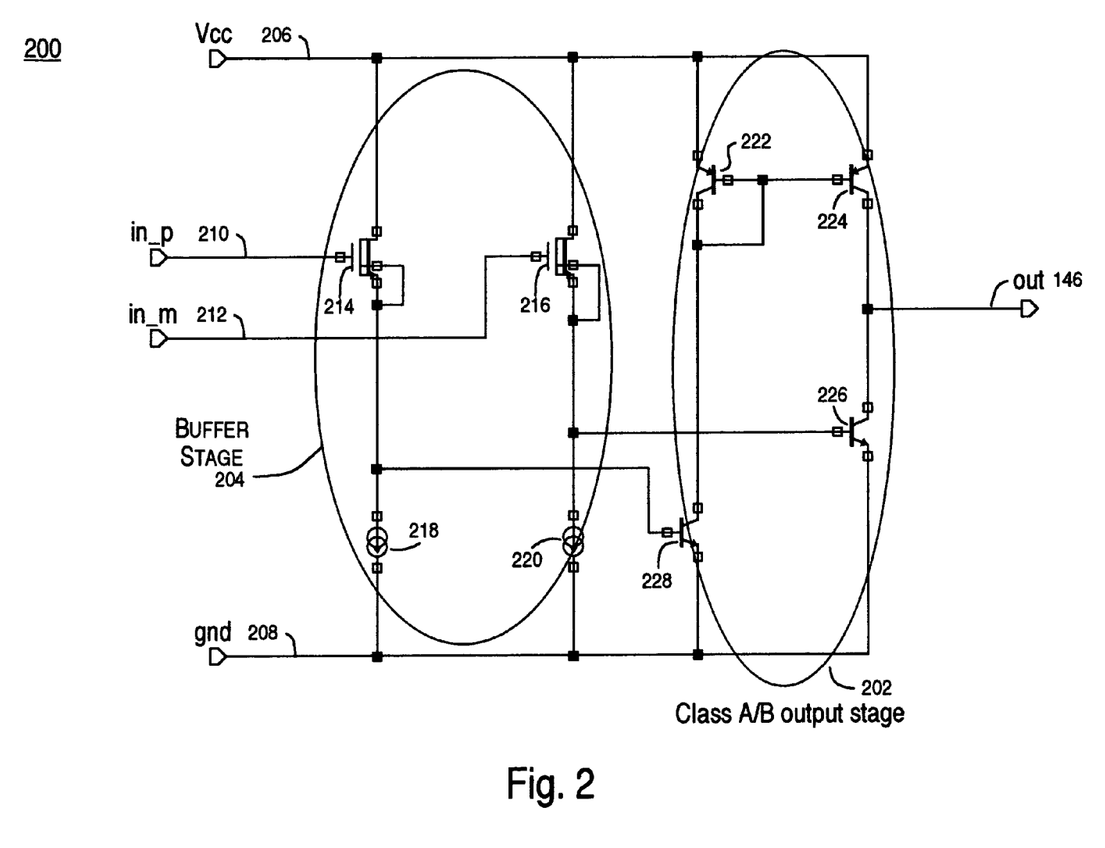
FIG. 2 is a schematic diagram of an exemplary output stage and buffer stage in accordance with various embodiments of the invention.

FIG. 2 is a schematic diagram 200 of an exemplary class A/B output stage 202 and buffer stage 204 in accordance with various embodiments of the invention that can be implemented as part of a self-biased operational amplifier (e.g., 100). Specifically, the class A/B output stage 202 can include, but is not limited to, transistors 222, 224, 226 and 228 while the buffer stage 204 can include, but is not limited to, transistors 214 and 216 along with external bias currents 218 and 220. Note that the buffer stage 204 can be implemented as part of the self-biased operational amplifier (e.g., 100) in order to prevent the loading of the input stage of the self-biased operational amplifier (e.g., 100) by the output stage 202.

It is pointed out that in one embodiment, the output stage 144 of FIG. 1 can be implemented with the class A/B output stage 202 of FIG. 2, but is not limited to such. Furthermore in an embodiment, the buffer stage 142 of FIG. 1 can be implemented with the buffer stage 204 of FIG. 2, but is not limited to such. Note that if the class A/B output stage 202 and the buffer stage 204 are implemented as part of the self-biased operational amplifier 100 of FIG. 1, the positive input 210 can be coupled to the collectors of transistors 114 and 122 while the negative input 212 can be coupled to the collectors of transistors 116 and 124. Additionally, the base of transistor 226 can be coupled to the gate of transistor 136 while the base of transistor 228 can be coupled to the gate of transistor 132. In this manner, transistor 136 can be sensing the base voltage of transistor 226 while transistor 132 can be sensing the base voltage of transistor 228.

Within FIG. 2, one of the functions of the class A/B output control circuit 202 is that one of transistors 224 and 226 is turned on. As such, when one of transistors 224 and 226 turns on, the other one turns off. Specifically, when the base voltage of transistor 226 goes high, there should not be any current flowing through transistor 224, and vice versa. One of the reasons for the class A/B output circuit 202 is to add the biasing voltage. Specifically, the base voltage of transistor 224 plus some voltage can be substantially constant to (or equal to) the base voltage of transistor 226 plus some other voltage.

Within circuit 200, a voltage source ($V_{CC}$) 206 having a high voltage value (logic "1") can be coupled to the drains of transistors 214 and 216 along with the emitters of transistors 222 and 224. The positive input 210 of buffer stage 210 can be coupled to the gate of transistor 214 while the source and substrate of transistor 214 can be coupled to the base of transistor 228 and a positive terminal of external bias current 218. The negative input 212 of buffer stage 210 can be coupled to the gate of transistor 216 while the source and substrate of transistor 216 can be coupled to the base of transistor 226 and a positive terminal of external bias current 220. The base and collector of transistor 222 can be coupled to the base of transistor 224 and the collector of transistor 228. The collector of transistor 224 can be coupled to the collector of transistor 226 and the output 146. A voltage ground (gnd) 208 having a low voltage value (e.g., logic "0") can be coupled to a negative terminal of external bias current 218, a negative terminal of external bias current 220, the emitter of transistor 228, and the emitter of transistor 226.

Within FIG. 2, note that each of transistors 214, 216, 222, 224, 226 and 228 can be implemented in a wide variety of ways. For example, each of transistors 214 and 216 can be implemented as, but is not limited to, an N-channel MOSFET (metal-oxide semiconductor field-effect transistor) which is also known as a NMOS or NFET. Furthermore, each of transistors 222 and 224 can be implemented as, but is not limited to, a PNP bipolar junction transistor (BJT). Moreover, each of transistors 226 and 228 can be implemented as, but is not limited to, a NPN bipolar junction transistor (BJT). It is noted that each of transistors 214, 216, 222, 224, 226 and 228 can be referred to as a switching element. Note that a gate, a drain, and a source of transistors 214 and 216 can each be referred to as a terminal of its transistor. Additionally, each gate of transistors 214 and 216 can also be referred to as a control terminal of its transistor. Also, an emitter, a base, and a collector of transistors 222, 224, 226 and 228 can each be referred to as a terminal of its transistor. Furthermore, each base of transistors 222, 224, 226 and 228 can also be referred to as a control terminal of its transistor. In one embodiment, transistors 214 and 216 can each be implemented as a PMOS device. Additionally in an embodiment, transistors 222 and 224 can each be implemented as a NPN transistor while transistors 226 and 228 can each be implemented as a PNP transistor.

Within FIG. 2, it is understood that circuit 200 may not include all of the elements illustrated by FIG. 2. Additionally, circuit 200 can be implemented to include one or more elements not illustrated by FIG. 2.

Figure 3:
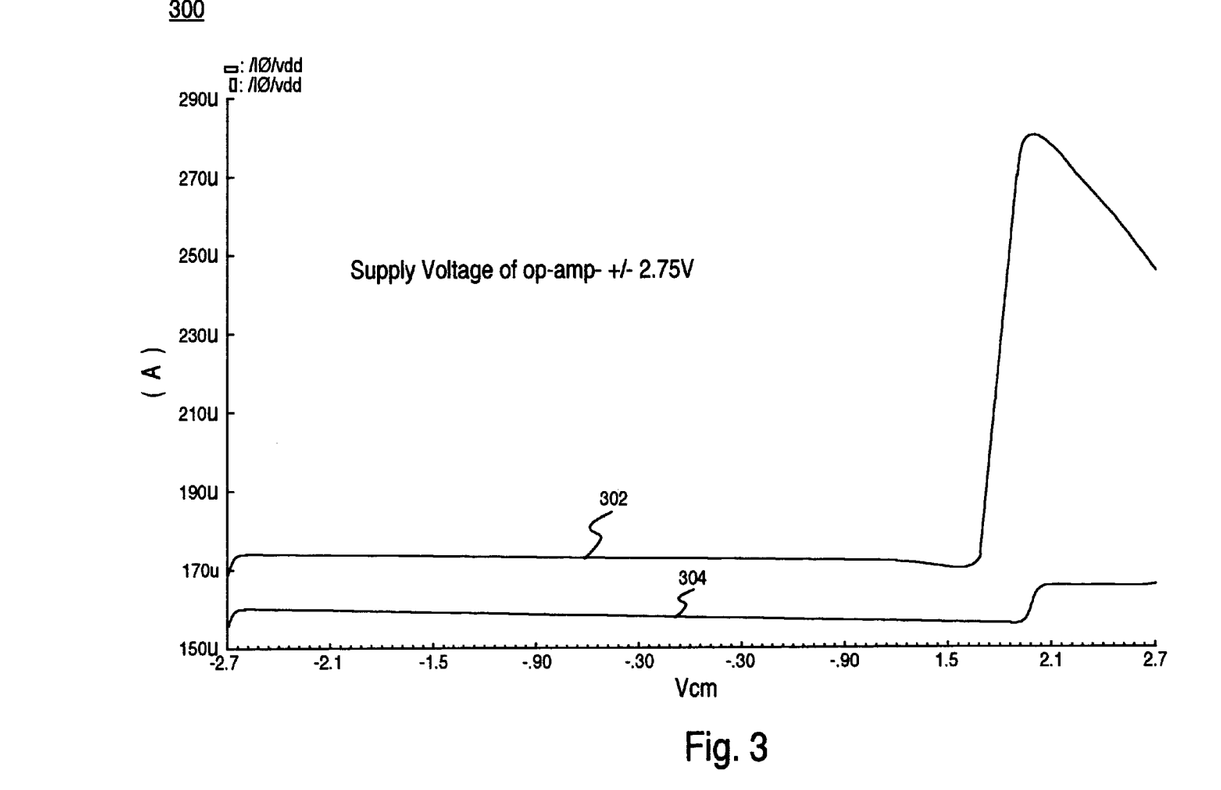
FIG. 3 is an exemplary graph that includes a simulation of the performance of a differential operational amplifier that includes a self-biased common-mode feedback circuit in accordance with various embodiments of the invention.

FIG. 3 is an exemplary graph 300 of a simulation that compared the performance of a differential operational amplifier (e.g., 100) that includes a self-biased common-mode feedback circuit (e.g., 154) in accordance with various embodiments of the invention against a conventional differential operational amplifier that includes a conventional common-mode feedback circuit. Specifically, the Y-axis of graph 300 represents a supply current measured in microamperes (uA or μA) while the X-axis of graph 300 represents a common-mode voltage (Vcm) measured in volts. It is noted that the supply current associated with graph 300 can be the total current drawn by each of the differential operational amplifiers. It is pointed out that the supply voltage associated with graph 300 was +/−2.75 volts for both the differential operational amplifier (e.g., 100) that includes the self-biased common-mode feedback circuit (e.g., 154) in accordance with various embodiments of the invention and the conventional differential operational amplifier that includes a conventional common-mode feedback circuit.

Graph 300 includes a simulation graph line 302 that represents the supply current versus the common-mode voltage for the conventional differential operational amplifier that includes a conventional common-mode feedback circuit. Furthermore, graph 300 includes a simulation graph line 304 that represents the supply current versus the common-mode voltage for the differential operational amplifier (e.g., 100) that includes the self-biased common-mode feedback circuit (e.g., 154) in accordance with various embodiments of the invention. It is pointed out that at approximately 1.74 to 1.8 volts of common-mode voltage, the conventional simulation graph line 302 experiences a huge variation in supply current when the input pair of the conventional differential operational amplifier is switched from a PNP input to an NPN input. Specifically, the common-mode voltage of the conventional simulation graph line 302 changes from approximately 170 microamperes up to approximately 279 microamperes and then decreases down to approximately 250 microamperes. Note that this huge variation in supply current is a waste of power and can adversely affect the operation of the conventional differential operational amplifier that includes the conventional common-mode feedback circuit.

Within FIG. 3, by way of comparison, at approximately 1.92 to 1.98 volts of common-mode voltage, the simulation graph line 304 in accordance with an embodiment of the invention experiences a small variation in supply current when the input pair of the differential operational amplifier (e.g., 100) that includes the self-biased common-mode feedback circuit (e.g., 154) is switched from a PNP input to an NPN input. Specifically, the common-mode voltage of the simulation graph line 304 in accordance with an embodiment of the invention changes from approximately 156 microamperes up to approximately 164 microamperes and then substantially remains at that amount of supply current. It is pointed out that this small variation in supply current conserves significantly more power than the conventional differential operational amplifier that includes the conventional common-mode feedback circuit. Moreover, in accordance with various embodiments, the differential operational amplifier (e.g., 100) that includes the self-biased common-mode feedback circuit (e.g., 154) continues to operate properly during the switch from the PNP input to the NPN input.

Figure 4:
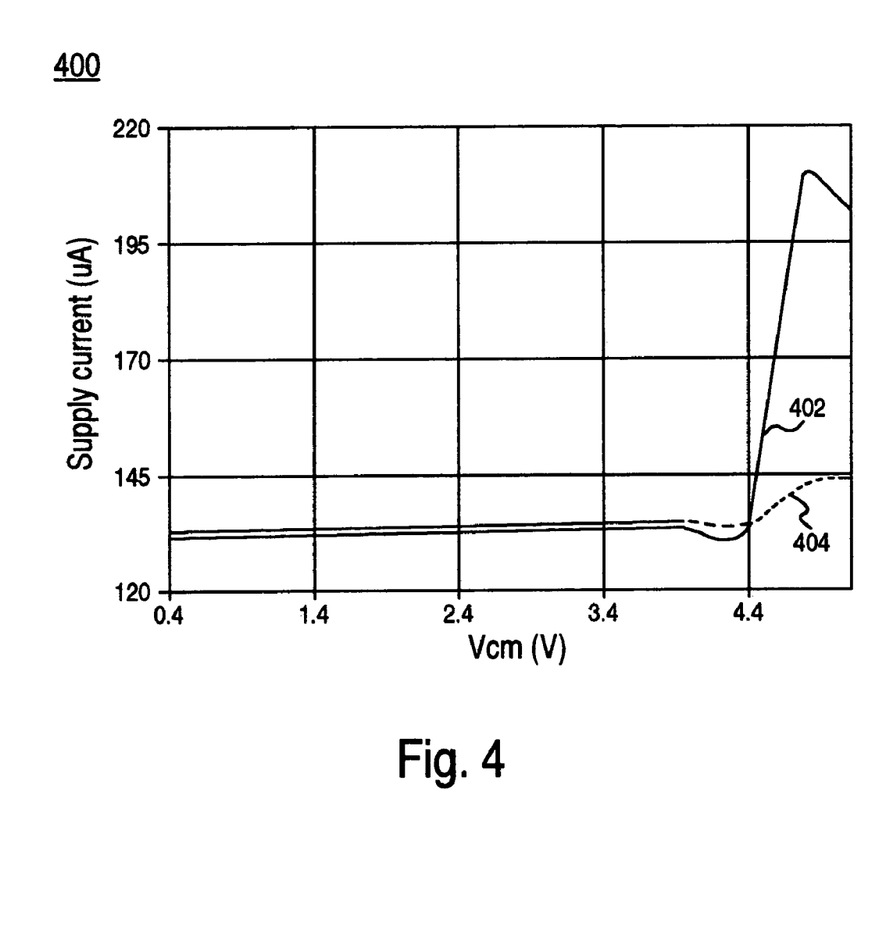
FIG. 4 is an exemplary graph that includes actual measurements of the performance of a silicon implemented differential operational amplifier that includes a self-biased common-mode feedback circuit in accordance with an embodiment of the invention.

FIG. 4 is an exemplary graph 400 of actual measurements that compared the performance of a silicon implemented differential operational amplifier (e.g., 100) that includes a self-biased common-mode feedback circuit (e.g., 154) in accordance with an embodiment of the invention against a silicon implemented conventional differential operational amplifier that includes a conventional common-mode feedback circuit. Specifically, the Y-axis of graph 400 represents a supply current measured in microamperes (uA or µA) while the X-axis of graph 400 represents a common-mode voltage (Vcm) measured in volts. It is noted that the supply current associated with graph 500 can be the total current drawn by each of the silicon implemented differential operational amplifiers. It is pointed out that the supply voltage associated with graph 300 was approximately +/−5.5 volts for both the silicon implemented differential operational amplifier (e.g., 100) that includes the self-biased common-mode feedback circuit (e.g., 154) in accordance with various embodiments of the invention and the silicon implemented conventional differential operational amplifier that includes a conventional common-mode feedback circuit.

Graph 400 includes a graph line 402 that represents the supply current versus the common-mode voltage for the silicon implemented conventional differential operational amplifier that includes a conventional common-mode feedback circuit. Furthermore, graph 400 includes a graph line 404 that represents the supply current versus the common-mode voltage for the silicon implemented differential operational amplifier (e.g., 100) that includes the self-biased common-mode feedback circuit (e.g., 154) in accordance with an embodiment of the invention. It is pointed out that at approximately 4.3 to 4.4 volts of common-mode voltage, the conventional graph line 402 experiences a huge variation in supply current when the input pair of the silicon implemented conventional differential operational amplifier is switched from a PNP input to an NPN input. Specifically, the common-mode voltage of the conventional graph line 402 changes from approximately 132 microamperes up to approximately 210 microamperes and then decrease down to approximately 200 microamperes. It is noted that this huge variation in supply current is a waste of power and can adversely affect the operation of the silicon implemented conventional differential operational amplifier that includes the conventional common-mode feedback circuit.

Within FIG. 4, by way of comparison, at approximately 4.4 to 4.5 volts of common-mode voltage, the graph line 404 in accordance with an embodiment of the invention experiences a small variation in supply current when the input pair of the silicon implemented differential operational amplifier (e.g., 100) that includes the self-biased common-mode feedback circuit (e.g., 154) is switched from a PNP input to an NPN input. Specifically, the common-mode voltage of the graph line 404 in accordance with an embodiment of the invention changes from approximately 134 microamperes up to approximately 145 microamperes and then substantially remains at that amount of supply current. It is pointed out that this small variation in supply current conserves significantly more power than the conventional silicon implemented differential operational amplifier that includes the conventional common-mode feedback circuit. Moreover, in accordance with various embodiments, the silicon implemented differential operational amplifier (e.g., 100) that includes the self-biased common-mode feedback circuit (e.g., 154) continues to operate properly during the switch from the PNP input to the NPN input.

Figure 5:
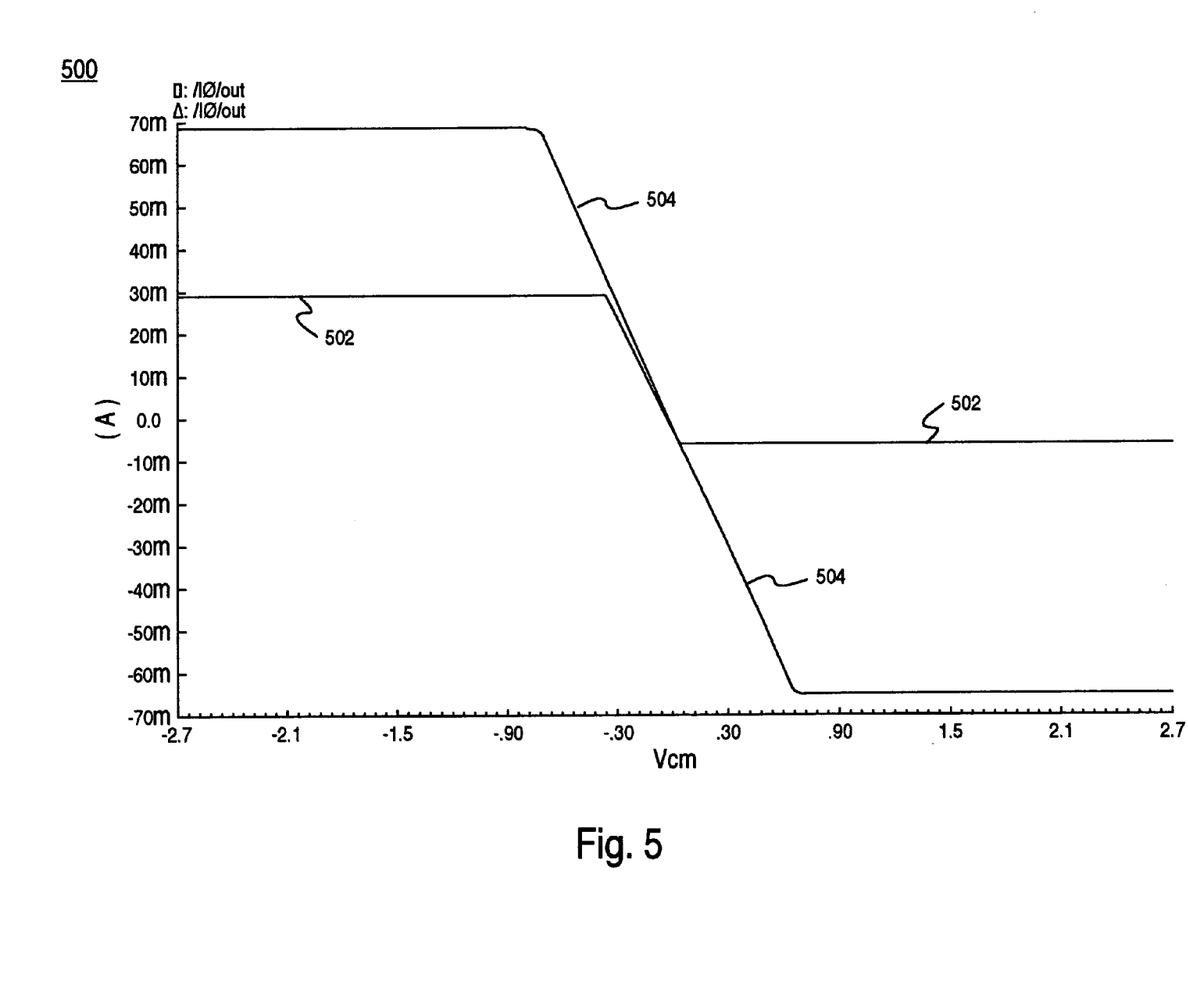
FIG. 5 is an exemplary graph that includes a simulation of the output short circuit current for a differential operational amplifier that includes a self-biased common-mode feedback circuit in accordance with various embodiments of the invention.

FIG. 5 is an exemplary graph 500 of a simulation that compared the output short circuit current for a differential operational amplifier (e.g., 100) that includes a self-biased common-mode feedback circuit (e.g., 154) in accordance with various embodiments of the invention against a conventional differential operational amplifier that includes a conventional common-mode feedback circuit. Specifically, the Y-axis of graph 500 represents an output short circuit current measured in milliamperes (mA) while the X-axis of graph 500 represents a common-mode voltage (Vcm) measured in volts. Note that the output short circuit current associated with graph 500 can also be referred to as the output drive current produced by each of the differential operational amplifiers.

Graph 500 includes a graph line 502 that represents the output drive current versus the common-mode voltage for the conventional differential operational amplifier that includes a conventional common-mode feedback circuit. Specifically, the conventional simulation graph line 502 goes from approximately 29 milliamperes to approximately −6.62 milliamperes. As such, the conventional simulation graph line 502 illustrates that the conventional differential operational amplifier that includes a conventional common-mode feedback circuit has a sourcing current of −6.62 milliamperes and a sinking current of 29 milliamperes.

Furthermore, within FIG. 5, graph 500 includes a simulation graph line 504 that represents the output drive current versus the common-mode voltage for the differential operational amplifier (e.g., 100) that includes the self-biased common-mode feedback circuit (e.g., 154) in accordance with various embodiments of the invention. Specifically, the simulation graph line 504 in accordance with an embodiment goes from approximately 68 milliamperes to approximately −64 milliamperes. Therefore, the simulation graph line 504 illustrates that the differential operational amplifier (e.g., 100) that includes the self-biased common-mode feedback circuit (e.g., 154) in accordance with various embodiments of the invention has a sourcing current of −64 milliamperes and a sinking current of 68 milliamperes. As such, the range of the output drive current of the differential operational amplifier (e.g., 100) that includes the self-biased common-mode feedback circuit (e.g., 154) in accordance with various embodiments of the invention is significantly greater than the range of the output drive current of the conventional differential operational amplifier that includes a conventional common-mode feedback circuit. One of the reasons for this result is that the differential operational amplifier (e.g., 100) that includes the self-biased common-mode feedback circuit (e.g., 154) enables a larger input voltage range than the conventional differential operational amplifier that includes a conventional common-mode feedback circuit. Moreover, it is pointed out that the large drive current on both the positive and negative sides enables the differential operational amplifier (e.g., 100) that includes the self-biased common-mode feedback circuit (e.g., 154) to produce more output current at low voltages than the conventional differential operational amplifier that includes a conventional common-mode feedback circuit.

Figure 6:
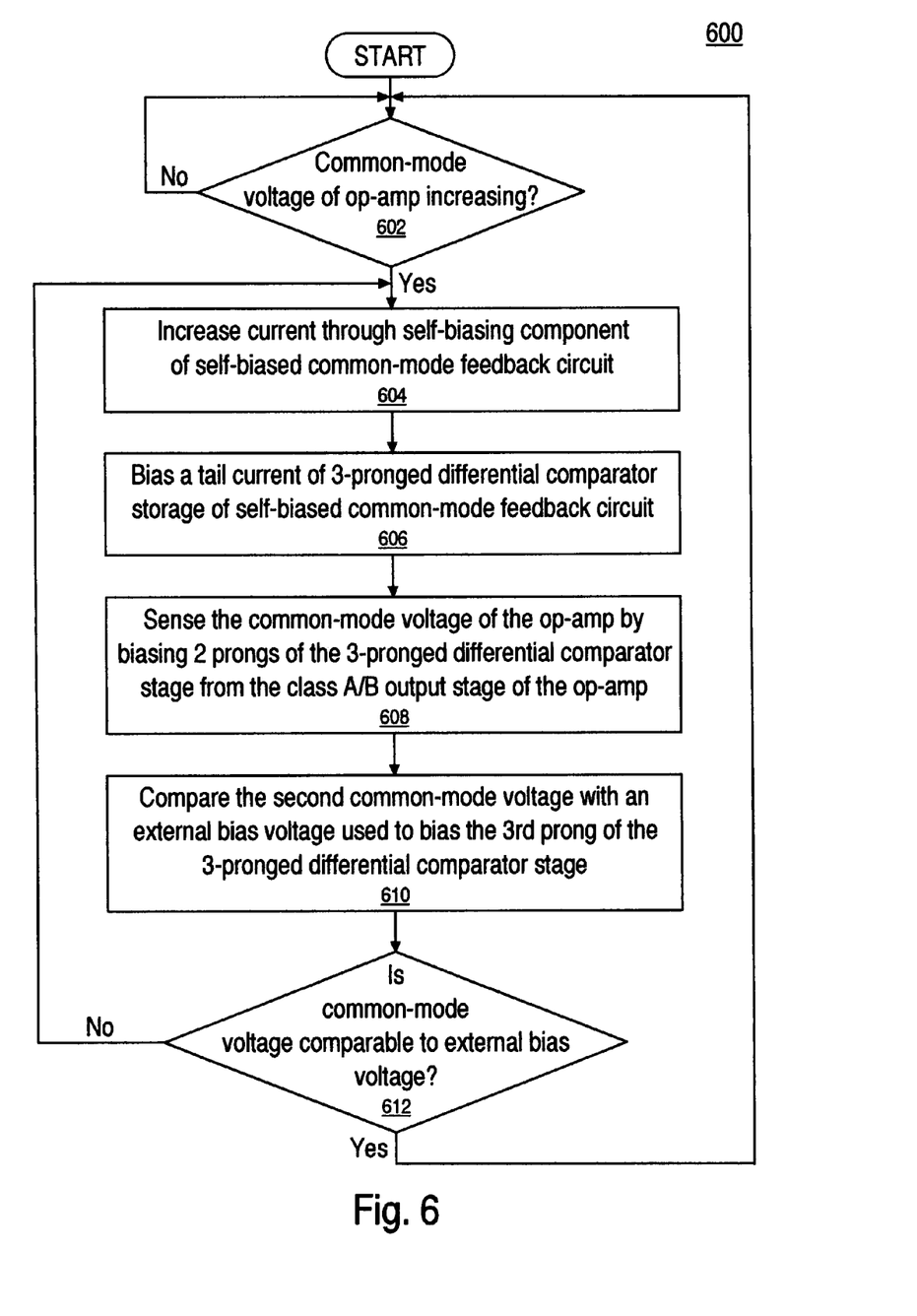
FIG. 6 is a flow diagram of an exemplary method in accordance with various embodiments of the invention.

FIG. 6 is a flowchart of a method 600 in accordance with various embodiments of the invention. Method 600 includes exemplary processes of embodiments of the invention which can be carried out by electronic circuitry. Although specific operations are disclosed in method 600, such operations are exemplary. That is, method 600 may not include all of the operations illustrated by FIG. 6. Also, method 600 may include various other operations and/or variations of the operations shown by FIG. 6. Likewise, the sequence of the operations of method 600 can be modified. It is noted that the operations of method 600 can each be performed by software, by firmware, by electronic circuitry, or by any combination thereof.

Specifically, method 600 can include a first determination as to whether a common-mode voltage of an operational amplifier (op-amp) is increasing. Note that the operational amplifier can include a self-biased common-mode feedback circuit and an output stage (e.g., class A/B output stage). If the common-mode voltage is not increasing, the first determination can be repeated. However, if the common-mode voltage of the operational amplifier is increasing, the current through a self-biasing component of the self-biased common-mode feedback circuit can be increased. The self-biased common-mode feedback circuit can include a three-pronged differential comparator stage. A tail current of the three-pronged differential comparator stage can be biased using the self-biasing component. The common-mode voltage of the operational amplifier can be sensed by biasing two prongs of the three-pronged differential comparator stage from the class A/B output stage of the operational amplifier. The sensed common-mode voltage can be compared with an external bias voltage used to bias the third prong of the three-pronged differential comparator stage. A second determination can be made as to whether the common-mode voltage of the operational amplifier is comparable or similar to the external bias voltage. If not, process 600 can proceed to the operation for increasing the current through the self-biasing component of the self-biased common-mode feedback circuit. However, if it is determined that the common-mode voltage of the operational amplifier is comparable to the external bias voltage, process 600 can proceed to the first determination.

At operation 602 of FIG. 6, a determination can be made as to whether a common-mode voltage of an operational amplifier (e.g., 100) is increasing. Note that in an embodiment the operational amplifier can include a self-biased common-mode feedback circuit (e.g., 154) and an output stage (e.g., 144). If the common-mode voltage is not increasing at operation 602, process 600 can proceed to the beginning of operation 602. However, if the common-mode voltage of the operational amplifier is increasing at operation 602, process 600 can proceed to operation 604. Note that operation 602 can be implemented in a wide variety of ways. For example, operation 602 can be implemented in any manner similar to that described herein, but is not limited to such.

At operation 604, the current through a self-biasing component (e.g., transistors 138, 140, 112 and 110) of the self-biased common-mode feedback circuit can be increased. It is noted that in an embodiment the self-biased common-mode feedback circuit can include a three-pronged differential comparator stage (e.g., 156). Operation 604 can be implemented in a wide variety of ways. For example, operation 604 can be implemented in any manner similar to that described herein, but is not limited to such.

At operation 606 of FIG. 6, a tail current of the three-pronged differential comparator stage can be biased using the self-biasing component. It is pointed out that operation 606 can be implemented in a wide variety of ways. For example, operation 606 can be implemented in any manner similar to that described herein, but is not limited to such.

At operation 608, the common-mode voltage of the operational amplifier can be sensed or detected by biasing two prongs (e.g., transistors 132 and 136) of the three-pronged differential comparator stage from the class A/B output stage (e.g., 144) of the operational amplifier. Note that operation 608 can be implemented in a wide variety of ways. For example, operation 608 can be implemented in any manner similar to that described herein, but is not limited to such.

At operation 610 of FIG. 6, the sensed common-mode voltage can be compared with an external bias voltage (e.g., 130) used to bias the third prong (e.g., transistor 134) of the three-pronged differential comparator stage. It is noted that operation 610 can be implemented in a wide variety of ways. For example in an embodiment, the external bias voltage at operation 610 can be a voltage source that is independent of the self-biased common-mode feedback circuit (e.g., 154), wherein the external bias voltage can be external and/or internal to the operational amplifier (e.g., 100). Note that operation 610 can be implemented in any manner similar to that described herein, but is not limited to such.

At operation 612, a determination can be made as to whether the common-mode voltage of the operational amplifier is comparable (or similar) to the external bias voltage. If the common-mode voltage is not comparable to the external bias voltage at operation 612, process 600 can proceed to operation 604. However, if it is determined at operation 612 that the common-mode voltage of the operation amplifier is comparable to the external bias voltage, process 600 can proceed to operation 602.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. An operational amplifier comprising:
a first folded cascode transistors for receiving currents from a first differential input stage;
a second folded cascode transistors for receiving currents from a second differential input stage, said second folded cascode transistors coupled to said first folded cascode transistors;
a buffer stage coupled to said first folded cascode transistors and said second folded cascode transistors;
a self-biased common-mode feedback circuit coupled to said second folded cascode transistors and said buffer stage; and
an output stage coupled to said self-biased common-mode feedback circuit and said buffer stage.

2. The operational amplifier of claim 1, wherein said self-biased common-mode feedback circuit comprises a differential comparator stage coupled to said output stage and said buffer stage.

3. The operational amplifier of claim 2, wherein said differential comparator stage comprises a three-pronged differential comparator stage.

4. The operational amplifier of claim 3, wherein said three-pronged differential comparator stage comprises three switching elements.

5. The operational amplifier of claim 1, wherein said self-biased common-mode feedback circuit comprises a self-biasing component.

6. The operational amplifier of claim 5, wherein said self-biasing component comprises four switching elements.

7. The operational amplifier of claim 1, wherein said self-biased common-mode feedback circuit for receiving a bias voltage.

8. A method comprising:
determining if a common-mode voltage of an operational amplifier is increasing, said operational amplifier comprises:
a first folded cascode transistors for receiving currents from a first differential input stage;
a second folded cascode transistors for receiving currents from a second differential input stage, said second folded cascode transistors coupled to said first folded cascode transistors;
a buffer stage coupled to said first folded cascode transistors and said second folded cascode transistors;
a self-biased common-mode feedback circuit coupled to said second folded cascode transistors and said buffer stage, and
an output stage coupled to said self-biased common-mode feedback circuit and said buffer stage;
increasing current through a self-biasing component of said self-biased common-mode feedback circuit if said common-mode voltage is increasing; and
biasing a tail current of a differential comparator stage of said self-biased common-mode feedback circuit after said increasing said current through said self-biasing component.

9. The method of claim 8, wherein said increasing said current through said self-biasing component comprises utilizing said differential comparator stage.

10. The method of claim 8, further comprising:
sensing said common-mode voltage by biasing two prongs of said differential comparator stage from an output stage of said operational amplifier.

11. The method of claim 10, further comprising:
comparing said sensed common mode voltage with a voltage source used to bias a third prong of said differential comparator stage.

12. The method of claim 11, wherein said differential comparator stage comprises a three-pronged differential comparator stage.

13. The method of claim 11, further comprising:
determining if said common-mode voltage is similar to said voltage source.

14. The method of claim 13, further comprising:
repeating said increasing said current through said self-biasing component if said common-mode voltage is not similar to said voltage source.

15. A differential operational amplifier comprising:
PNP folded cascode transistors for receiving currents from a first differential input stage;
NPN folded cascode transistors for receiving currents from a second differential input stage, said NPN folded cascode transistors coupled to said PNP folded cascode transistors;
a buffer stage coupled to said PNP folded cascode transistors and said NPN folded cascode transistors;
a self-biased common-mode feedback circuit coupled to said NPN folded cascode transistors and said buffer stage; and
an output stage coupled to said self-biased common-mode feedback circuit and said buffer stage.

16. The differential operational amplifier of claim 15, wherein said self-biased common-mode feedback circuit comprises a three-pronged differential comparator stage coupled to said output stage and said buffer stage.

17. The differential operational amplifier of claim 16, wherein said three-pronged differential comparator stage comprises three transistors.

18. The differential operational amplifier of claim 17, wherein the sources of said three transistors are coupled together.

19. The differential operational amplifier of claim 18, wherein said sources of said three transistors are coupled to said NPN folded cascode transistors.

20. The differential operational amplifier of claim 18, wherein one of said three transistors is biased from a voltage source independent of said self-biased common-mode feedback circuit.

* * * * *